United States Patent
Shinoda

(10) Patent No.: US 7,092,071 B2
(45) Date of Patent: Aug. 15, 2006

(54) EXPOSURE APPARATUS AND METHOD, AND DEVICE FABRICATING METHOD USING THE SAME

(75) Inventor: Kenichiro Shinoda, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/253,339

(22) Filed: Oct. 18, 2005

(65) Prior Publication Data

US 2006/0050259 A1    Mar. 9, 2006

Related U.S. Application Data

(63) Continuation of application No. 10/364,879, filed on Feb. 12, 2003, now Pat. No. 7,009,681.

(30) Foreign Application Priority Data

Feb. 13, 2002    (JP) .............................. 2002-034851

(51) Int. Cl.
  G03B 27/54    (2006.01)
  G03B 27/42    (2006.01)
  G03B 27/32    (2006.01)

(52) U.S. Cl. .............................. 355/67; 355/53; 355/77

(58) Field of Classification Search ................. 355/53, 355/67, 68, 71, 77; 430/311; 359/649; 250/492.2, 492.22
See application file for complete search history.

(56) References Cited

U.S. PATENT DOCUMENTS

| | | | |
|---|---|---|---|
| 4,947,030 A | 8/1990 | Takahashi |
| 5,659,429 A | 8/1997 | Kudo |
| 5,726,739 A | 3/1998 | Hayata |
| 6,051,842 A | 4/2000 | Yamamoto |
| 6,127,095 A | 10/2000 | Kudo |
| 6,281,964 B1 | 8/2001 | Sato |
| 6,285,442 B1 | 9/2001 | Sato |
| 6,333,777 B1 | 12/2001 | Sato |
| 6,466,303 B1 | 10/2002 | Omura et al. |
| 6,560,044 B1 | 5/2003 | Shinoda |
| 6,563,567 B1 | 5/2003 | Komatsuda et al. |
| 6,614,597 B1 | 9/2003 | Mizouchi |
| 2003/0021579 A1 | 1/2003 | Shinoda |
| 2003/0038937 A1 | 2/2003 | Sato |

FOREIGN PATENT DOCUMENTS

| | | |
|---|---|---|
| EP | 1 014 196 A2 | 6/2000 |
| JP | 6-196389 A | 7/1994 |
| JP | 6-204123 A | 7/1994 |
| JP | 7-130610 A | 5/1995 |
| JP | 07-176475 | 7/1995 |
| JP | 09-027450 | 1/1997 |
| JP | 09-036026 | 2/1997 |

(Continued)

OTHER PUBLICATIONS

English translation of the Japanese Patent Document 11-087232.*
English translation of the Japanese Patent Document 2000-195778.*

(Continued)

*Primary Examiner*—Alan Mathews
(74) *Attorney, Agent, or Firm*—Morgan & Finnegan, L.L.P.

(57) ABSTRACT

An exposure apparatus includes a projection optical system for exposing and transferring a pattern on a mask onto an object, an illumination optical system for forming a secondary light source surface approximately conjugate with a pupil in the projection optical system, and for illuminating the mask, and a mechanism for making non-uniform at least one of a transmittance distribution from the secondary light source to the object and a light intensity distribution on the secondary light source surface.

5 Claims, 11 Drawing Sheets

FOREIGN PATENT DOCUMENTS

| | | |
|---|---|---|
| JP | 10-135123 A | 5/1998 |
| JP | 10-303123 | 11/1998 |
| JP | 10-303123 A | 11/1998 |
| JP | 11-087232 | 3/1999 |
| JP | 11-87232 | 3/1999 |
| JP | 11-087232 A | 3/1999 |
| JP | 11-087232 A5 | 3/1999 |
| JP | 11-317348 | 11/1999 |
| JP | 11-317349 | 11/1999 |
| JP | 11-317349 A | 11/1999 |
| JP | 11-354424 | 12/1999 |
| JP | 2000-3852 | 1/2000 |
| JP | 2000-195778 | 7/2000 |
| JP | 2000-260698 A | 9/2000 |
| JP | 2000-260968 | 9/2000 |
| JP | 2001-250762 | 9/2001 |
| JP | 2001-284236 | 10/2001 |
| JP | 2003-100622 | 4/2003 |

OTHER PUBLICATIONS

English translation of Japanese Patent Document 11-087232.

English translation of Japanese Patent Document 11-354424.

English translation of Japanese Patent Document 2000-195778.

English translation of Japanese Patent Document 2001-284236.

English translation of the Office Action from the Patent Office of the People's Republic of China for Appl. No. 031041078 dated Oct. 1, 2004. (3 pages).

An Office Action from the Patent Office of the People's Republic of China for Appl. No. 031041078 dated Oct. 1, 2004. (7 pages).

English translation of Japanese Office action dated Feb. 8, 2005 for Appl. No. 2002-034851.

"Notice of Reasons of Rejection" of Japanese Patent Application No. 2002-034851; dated Feb. 28, 2006 (4 pages, including 2-page English translation).

* cited by examiner

EXPOSURE APPARATUS AND METHOD, AND DEVICE FABRICATING METHOD USING THE SAME

This application is a continuation of prior application Ser. No. 10/364,879, filed Feb. 12, 2003 now U.S. Pat. No. 7,009,681, the contents of which are hereby incorporated by reference in their entirety.

BACKGROUND OF THE INVENTION

The present invention relates to exposure apparatuses and device fabrication methods using the same. The present invention is particularly suitable for an exposure-apparatus used for micro-lithography to form a fine pattern for semiconductors, liquid crystal devices ("LCDs"), magnetic materials, etc.

The device fabrication using the lithography technique has employed a projection exposure apparatus that uses a projection optical system to project a circuit pattern formed on a mask or reticle (these terms are used interchangeably in this application) onto a wafer, thereby transferring the circuit pattern.

In general, the projection exposure apparatus includes an illumination optical system for illuminating the mask using light emitted from a light source, and the projection optical system, located between the mask and an object to be exposed. The illumination optical system typically introduces light from the light source to an optical integrator, such as a fly-eye lens, to obtain a uniform illumination area, and uses an optical-integrator exit surface as a secondary light source surface to Koehler-illuminate a mask surface via a condenser lens.

A most effective light source should be formed according to reticle patterns for high quality exposure. The effective light source means an angular distribution of the exposure light incident onto a wafer surface. For example, this effective light source distribution is implemented by adjusting to a desired shape a light intensity distribution near the fly-eye-lens exit surface i.e., a secondary light source surface.

FIG. 9 shows a relationship among a secondary light source distribution, a pupil transmittance distribution, and an effective light source distribution in a conventional exposure apparatus. Although the secondary light source distribution may form various shapes including a circular shape and an annular shape according to reticle patterns, it indicates an illumination condition with coherence factor σ=0.8. As in the illustrated secondary light source distribution, the conventional light intensity distribution has been adjusted to be uniform or flat. Since the pupil transmittance distribution is approximately uniform, the effective light source distribution becomes uniform on the wafer surface, providing σ=0.8 uniformly without any difference of effective light source distribution between an on-axis and an off-axis.

The resolution R of the projection exposure apparatus is given by the following equation where $\lambda$ is a wavelength of the light source, NA is the numerical aperture, and $k_1$ is a constant determined by a development process and others:

$$R = k_1(\lambda/NA) \quad (1)$$

The recent demands for highly integrated devices have increasingly required fine patterns to be transferred or higher resolution. From the above equation, a higher numerical aperture NA and reduced wavelength $\lambda$ would be effective to obtain the higher resolution.

Thus, an exposure light source used for the exposure apparatus has shifted to a shorter wavelength from i-line (with a wavelength of 365 nm) to KrF excimer laser (with a wavelength of 248 nm), ArF excimer laser (with a wavelength of 193 nm), and even $F_2$ laser (with a wavelength of 157 nm). NA has shifted larger from 0.7 to 0.75.

However, such a short wavelength as 200 nm or less and NA of 0.70 or higher (i.e., high NA) have created a problem in that the secondary light source distribution and the effective light source distribution do not accord with each other, and the effective light source distribution does not become uniform even when the secondary light source distribution is made uniform, lowering the exposure performance.

In other words, the higher NA results in a larger light incident angle onto each optical element, making it difficult to maintain constant an angular characteristic of the transmittance (and reflectance) in a required incident angle area. More specifically, the transmittance near the optical axis appears to be low because a light transmitting element, such as a lens, is thick at its center part and thin at its peripheral in view of the glass material's transmittance, but the transmittance at the peripheral actually becomes lower because a coating or reflection prevention film affects the transmittance more greatly. This is because the transmittance decreases more remarkably as a refraction angle of light incident onto the optical element becomes larger due to the coating, and the light transmitting through the peripheral of the light transmitting element has larger refraction angle than that transmitting through its center part. Although the conventional design technique has succeeded in maintaining within a permissible range, the transmittance reduction caused by the refraction angle at the peripheral, the refraction angle has become larger with the higher NA and the transmittance reduction has been unable to be maintained within the permissible range. In addition, the shorter wavelength limits usable materials for a reflection prevention film applied onto the transmission member, and restricts a degree of freedom of design.

FIG. 10 shows a relationship among a secondary light source distribution, a pupil transmittance distribution, and an effective light source distribution in an exposure apparatus having a high NA. The secondary light source distribution is set to have a uniform coherence factor σ=0.8, similar to FIG. 9. However, the lower pupil transmittance distribution at its peripheral as shown in the middle in FIG. 10 results in a non-uniform effective light source distribution, as well as a non-uniform effective a value of less of less than 0.8.

FIG. 11 shows a relationship among a secondary light source distribution, a pupil transmittance distribution, and an effective light source distribution in an exposure apparatus having a catadioptric projection optical system. The secondary light source distribution is set to have a uniform coherence factor σ=0.8, similar to FIG. 9. However, the non-uniform pupil transmittance distribution as shown in the middle in FIG. 11 prevents from the effective light source distribution from being uniform, as well as providing a non-uniform effective σ value of less of less than 0.8. In particular, a mirror has different reflectance depending upon a deflection angle. Here, the pupil transmittance in this application means optical use efficiency in an optical system including reflectance.

Thus, the optical system in the exposure apparatus has different transmittances between part near the optical axis and part apart from the optical axis, and provides eccentric angular distribution of the exposure light incident onto the wafer (i.e., effective light source distribution). Disadvantageously, this results in an undesirable angular distribution of the exposure light incident onto the wafer surface (i.e., effective light source distribution) even when the secondary light source distribution is adjusted to a desired distribution since the subsequent optical system has a non-uniform transmittance distribution (or pupil transmittance distribution). In other words, a predetermined resolution critical dimension (in particular, minimum line width) cannot disadvantageously obtained because this results in exposure with a coherence factor different from a most suitable one.

This problem occurs at wafer center positions (on-axis) and wafer peripheral (off-axis), but another problem of an offset center of gravity occurs at the off-axis in which a deviation of an effective light source distribution incident onto the on-axis deviates differently from that incident onto the off-axis. As a result, in addition to the above problem, the off-axis critical dimension to be transferred to the wafer is different according to positions.

BRIEF SUMMARY OF THE INVENTION

Accordingly, it is an exemplary object of the present invention to provide an exposure method and apparatus, and device fabrication method, which may obtain improved angular distribution of exposure light (or effective light source distribution) even for non-uniform transmittance distribution of an optical system (or pupil transmittance distribution), and reduce a difference in effective light source distribution between a substrate center and a substrate peripheral.

An exposure apparatus of one aspect of the present invention includes a projection optical system for exposing and transferring a pattern on a mask onto an object, an illumination optical system for forming a secondary light source surface approximately conjugate with a pupil in the projection optical system, and for illuminating the mask, and a mechanism for making non-uniform at least one of a transmittance distribution from the secondary light source surface to the object and a light intensity distribution on the secondary light source surface.

The transmittance distribution and the light intensity distribution on the secondary light source surface may be complementary to each other. The light intensity distribution on the secondary light source surface may increase in a direction going away from the optical axis. The illumination optical system may include a first fly-eye lens for illuminating the pattern on the mask, and a second fly-eye lens for illuminating the first fly-eye lens, wherein the mechanism includes a controller for controlling transmittance according to an angular distribution of exposure light near an exit end of the second fly-eye lens. The controller may increase the transmittance as an oblique incidence angle of the exposure light increases. The controller may include a glass plate onto which a film for controlling transmittance is applied, the glass plate being inclinable relative to an optical axis. The controller may include plural members that have different transmittance control amounts and are exchangeable according to illumination conditions.

An exposure apparatus of another aspect of the present invention includes a projection optical system for exposing and transferring a pattern on a mask onto an object, an illumination optical system for forming a secondary light source surface approximately conjugate with a pupil in the projection optical system, and for illuminating the mask, and a secondary light-source adjusting mechanism for adjusting a light intensity distribution on the secondary light source surface according to transmittance distributions from the secondary light source surface to the object.

The secondary light-source adjusting mechanism may adjust the light intensity distribution on the secondary light source surface according to the transmittance distributions from the secondary light source surface to the object and switching illumination conditions. The secondary light-source adjusting mechanism may adjust an angular distribution of exposure light incident onto the object. The secondary light-source adjusting mechanism may adjust the light intensity distribution on the secondary light source surface with respect to each of a rotationally symmetrical component and a rotationally asymmetrical component according to the transmittance distributions.

The secondary light-source adjusting mechanism may include a condenser optical system, a light mixture mechanism for reflecting and mixing light exiting from the condenser optical system, and an imaging zoom lens for imaging a light intensity distribution formed at an exit surface of the light mixture mechanism at a position approximately conjugate with the secondary light source surface, wherein the secondary light-source adjusting mechanism adjusts the light intensity distribution on the secondary light source surface by adjusting a divergent angle from the condenser optical system. The exposure apparatus may further include a mechanism for adjusting a focal distance of the condenser optical system according to the transmittance distributions from the secondary light source surface to the object. The mechanism for adjusting the focal distance may adjust the focal distance of the condenser optical system according to switching illumination conditions. The exposure apparatus may further include a drive mechanism for eccentrically driving divergent light emitted from the condenser optical system relative to the light mixture mechanism. The drive mechanism may adjust an eccentricity amount according to switching illumination conditions.

The secondary light-source adjusting mechanism may include a condenser optical system, a light mixture mechanism for reflecting and mixing light exiting from the condenser optical system, an imaging zoom lens for imaging a light intensity distribution formed at an exit surface of the light mixture mechanism at a position approximately conjugate with the secondary light source surface, and a transmittance correction filter for correcting transmittance near an exit surface of the light mixture means. There may be plural transmittance correction filters for correcting the transmittance distribution with different correction amounts in a rotationally symmetrical manner, and one of the filters being exchangeably selected according to illumination conditions. The exposure apparatus may further include a drive mechanism for driving and shifting the transmittance correction filter in a parallel direction with a shift amount that is adjustable according to switching illumination conditions.

The secondary light-source adjusting mechanism may include a condenser optical system, a light mixture mechanism for reflecting and mixing light exiting from the condenser optical system, and an imaging zoom lens for imaging a light intensity distribution formed at an exit surface of the light mixture mechanism at a position approximately conjugate with the secondary light source surface, wherein the imaging zoom lens serves to adjust distortion according to transmittance distributions from the secondary light source surface to the object. The exposure apparatus may further include a detector for detecting an angular distribution of exposure light incident onto the object, and the secondary light-source adjusting mechanism drives according to a detection result by the detector.

An exposure apparatus of another aspect of the present invention includes a projection optical system for exposing and transferring a pattern on a mask onto an object, an illumination optical system for forming a secondary light source approximately conjugate with a pupil in the projection optical system, and for illuminating the mask, and a convex meniscus lens provided at the object or at a position approximately conjugate with the object according to transmittance distributions from the secondary light source surface to the object.

The above exposure apparatus may expose the pattern on the mask onto the object through the projection optical system by sequentially moving the mask and the object to positions corresponding to a projection demagnification of the projection optical system in a direction perpendicular to an optical axis in the projection optical system. Alternatively, the above exposure apparatus may expose the pattern on the mask onto the object through the projection optical system by moving the mask and the object to positions at a speed ratio corresponding to a projection demagnification of the projection optical system in a direction perpendicular to an optical axis in the projection optical system.

An exposure method of another aspect of the present invention for projecting and exposing a pattern on a mask onto an object using the above exposure apparatus includes the steps of detecting a change of an angular distribution of exposure light incident on the object, and correcting the angular distribution based on a detection result.

A device fabricating method includes the steps of projecting and exposing a pattern on a mask onto an object using the above exposure apparatus, and developing the exposed object.

Claims for the device fabricating method that exhibits operations similar to those of the above exposure apparatus cover devices as their intermediate products and finished products. Moreover, such devices include, e.g., semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

Figure 1:
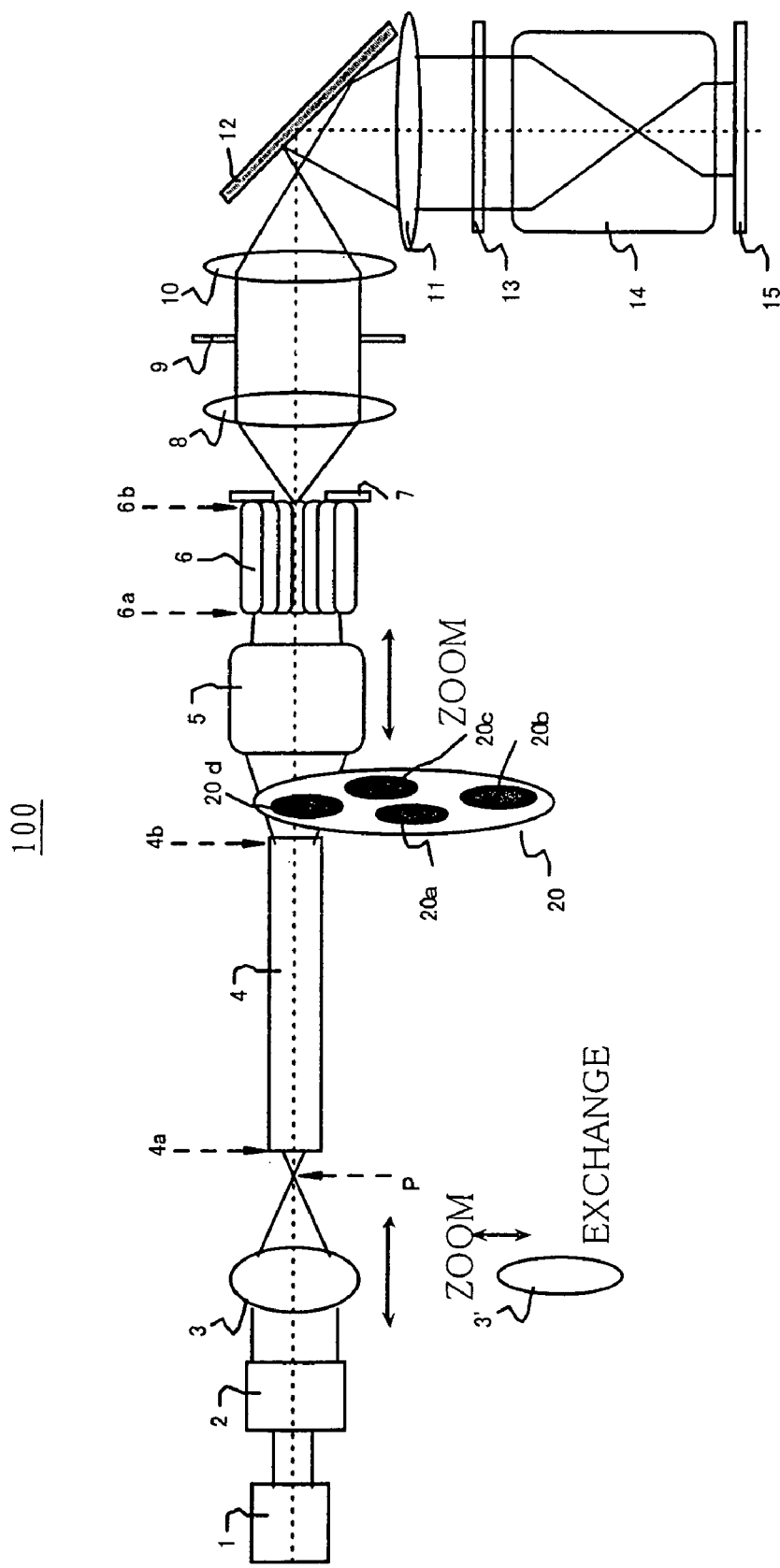
FIG. 1 is a schematic view of a simplified optical path in an exposure apparatus of a first embodiment according to the present invention.

A description will now be given of an exposure apparatus 100 of a first embodiment according to the present invention with reference to the accompanying drawings. Here, FIG. 1 is a schematic view of a simplified optical path in the exposure apparatus 100. The exposure apparatus 100 includes an illumination apparatus, a reticle 13, a projection optical system 14, and a plate 15. The exposure apparatus 100 is a projection exposure apparatus for exposing a circuit pattern formed on the reticle 13 onto the plate 15 in a step-and-repeat method and step-and-scan method.

The illumination apparatus illuminates the reticle 13 that forms a circuit pattern to be transferred, and includes a light source part and an illumination optical system.

The light source part includes a light source 1 and a beam shaping system 2.

The light source 1 may use, for example, an ArF excimer laser with a wavelength of about 193 nm, an $F_2$ excimer laser of a wavelength of about 157 nm, etc. The beam shaping system 2 may use, for example, a beam expander having a plurality of cylindrical lenses etc., and convert parallel light having a different aspect ratio from the laser light source 1 into a desired value (for example, by changing the sectional shape from a rectangle to a square), thus shaping the beam shape to a desired one. The beam shaping system 2 forms a beam that has a size and a divergent angle needed to illuminate the fly-eye lens 6, which will be described later.

The illumination optical system illuminates the mask 13, and includes a condenser optical system 3, an optical pipe 4 as a beam mixture means, an imaging zoom lens 5, a fly-eye lens 6, a stop 7, an illuminating lens 8, a field stop 9, imaging lenses 10 and 11, and a deflection mirror 12. The condenser optical system 3 condenses light, which has passed through the beam shaping system 2, near an incident surface 4a of the optical pipe 4, providing light entering the optical pipe 4 with a predetermined divergent angle. The condenser optical system 3 includes at least one lens element and a necessary deflecting mirror for deflecting the optical path. When the optical pipe 4 is made of a glass rod, a condensing point P by the condenser optical system 3 is defocused toward the light source from the incident surface 4a of the optical pipe 4, in order to enhance a coating (or reflection prevention film) at a glass-rod incident surface or endurance of the glass material itself.

The optical pipe 4 makes uniform, at its exit surface, the light intensity distribution that is not uniform at its incident surface as a result of repetitive side reflections of light entering from the condensing point P at a specific divergent angle.

The optical pipe 4 in this embodiment forms reflection surfaces of a hexagonal sectional shape, and is made, for example, of a glass-molded hexagonal column rod. Of course, such a structure is exemplary, and the section may be m-gonal (m: even number) or circular or a hollow rod.

The imaging zoom lens 5 images the optical pipe 4's exit surface 4b onto the fly-eye lens 6's incident surface under a specific demagnification, and both are in an approximately conjugate relationship. The zoom lens with a variable demagnification may adjust a range of light incident upon the fly-eye lens 6, and form multiple illumination conditions (or coherence factor σ values, i.e., illumination optical system's NA/projection optical system's NA).

The fly-eye lens 6 serves to provide a uniform illumination to an object plane. The fly-eye lens 6 is a wavefront splitting type optical integrator for splitting a wavefront of incident light, and for creating multiple light sources at or near an exit surface. The fly-eye lens 6 converts an angular distribution of incident light into a positional distribution. The incident surface and the exit surface on the fly-eye lens 6 are in a Fourier transformation relationship (the Fourier transformation relationship in the present specification means an optical relationship of a pupil plane and an object plane (or an image plane), and an object plane (an image plane) and a pupil plane.) Thus, the neighborhood of the fly-eye lens 6' exit surface 6b is a secondary light source. The fly-eye lens 6 is structured by combining many rod lenses (namely, fine lens elements) in this embodiment. However, the wavefront splitting type optical integrator applicable to the instant invention is not limited to a fly-eye lens, and it can be, for example, multiple sets of cylindrical lens array plates in which respective sets are arranged orthogonal to each other.

The stop 7 is a variable aperture stop that shields unnecessary light, creates a desired effective light source, and may use various stops having an ordinary circle, an annular illumination, etc. In order to replace a variable aperture stop, a disc turret that forms such aperture stops 7 may be prepared and a controller and drive mechanism (not shown) may switch the aperture by turning the turret, for instance.

The illumination lens 8 is, for example, a condenser lens for condensing as many secondary light sources formed near the fly-eye lens 6's exit surface 6b as possible, for superimposing them on the field stop 9, and for Koehler-illuminating the field stop 9.

The field stop 9 includes multiple mobile light blocking plates for forming an arbitrary aperture shape, and limits an exposure range on the reticle 13 surface as a surface to be illuminated (and even the wafer 15).

10 and 11 are imaging lenses for transferring an aperture shape of the field stop 9 onto the reticle 13 as a plane to be illuminated. 12 is a deflecting mirror that deflects light emitted from the imaging lens 10 so that it may enter the imaging lens 11 (and thus the mask 13). When the imaging lens 210 is arranged parallel to the imaging lens 10 in advance, the deflecting mirror 12 may be omitted. However, the deflecting mirror 12 in this structure contributes to miniaturization of the apparatus.

The mask 13 is, e.g., of quartz, on which a circuit pattern (or an image) to be transferred is created, and is supported and driven by a mask stage (not shown). Diffracted light through the mask 13 is projected through the projection optical system 14 onto the plate or wafer 15. The plate 15 is a target to be exposed, onto which resist is applied. The mask 13 and the plate 15 are located in a conjugate relationship. When the exposure apparatus 100 is a step-and-scan type exposure apparatus (namely, a scanner), it scans the mask 13 and the plate 15 to transfer the pattern on the mask 13 onto the plate 15. When the exposure apparatus 100 is a step-and-repeat type exposure apparatus (i.e., "a stepper"), the mask 13 and the plate 15 are kept stationary for exposure.

The mask stage (not shown) supports the mask 13, and is connected to a transport mechanism (not shown). The mask stage and projection optical system 14 are installed on a stage lens barrel stool supported via a damper, for example, to the base-frame placed on the floor. The mask stage may use any structure known in the art. The transport mechanism (not shown) is made up of a linear motor and the like, and drives the mask stage in a direction orthogonal to the optical axis, thus moving the mask 13. The exposure apparatus 100 uses a control unit (not shown) to synchronously scan the mask 13 and the plate 15.

The projection optical system 14 images, onto the plate 15, light that has passed through the pattern formed on the mask 13. The projection optical system 14 may use an optical system solely composed of a plurality of lens elements, an optical system comprised of a plurality of lens elements and at least one concave mirror (a catadioptric optical system), an optical system comprised of a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

The plate 15 is a wafer in this embodiment, but it may include a liquid crystal plate and a wide range of other objects to be exposed. Photoresist is applied onto the plate 15. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate 15 is supported by a wafer stage (not shown). The wafer stage may use any structure known in the art, and a detailed description of its structure and operations will be omitted. For example, the wafer stage uses a linear motor to move the plate 15 in a direction orthogonal to the optical axis. The mask 13 and plate 15 are, for example, scanned synchronously, and positions of the mask stage and wafer stage are monitored, for example, by a laser interferometer and the like, so that both are driven at a constant speed ratio. The wafer stage is installed on a stage barrel surface supported on the floor and the like, for example, via a damper.

Figure 10:
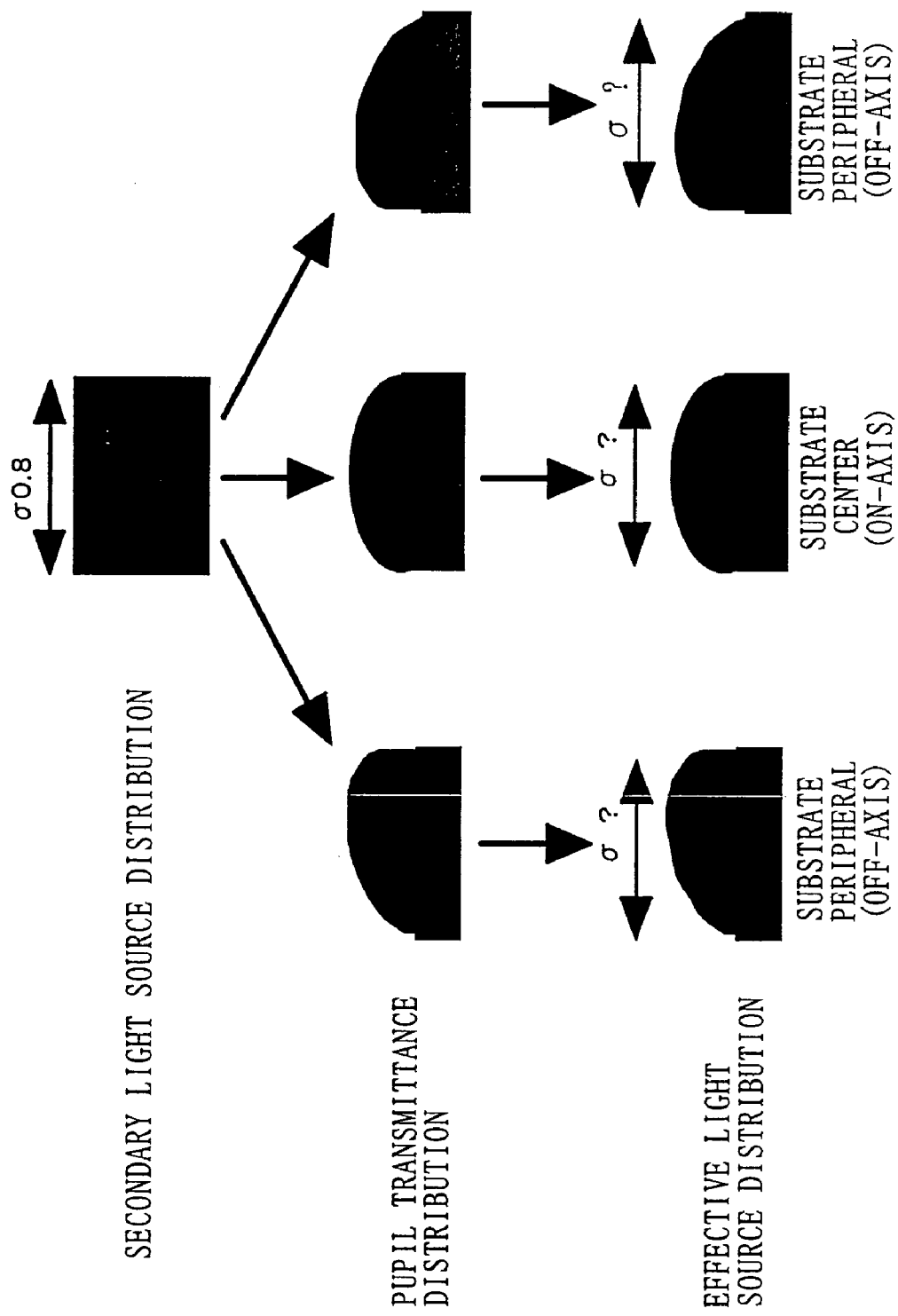
FIG. 10 shows a relationship among a secondary light source distribution, a pupil transmittance distribution, and an effective light source distribution in a conventional exposure apparatus using a higher NA and a shorter wavelength of light.

The instant embodiment contemplates a situation where the pupil transmittance distribution of the optical system from the secondary light source surface to the plate 15, which will be described later, becomes as shown in the middle of FIG. 10 with the shorter wavelength of the exposure light and higher NA. Since the pupil transmittance distribution in this situation tends to be lower at its peripheral, a desired effective light source distribution needs an adjustment that enhances the secondary light source distribution at its peripheral. A description will now be given of the secondary light-source adjusting mechanism.

(First Adjusting Mechanism)

Figure 2:
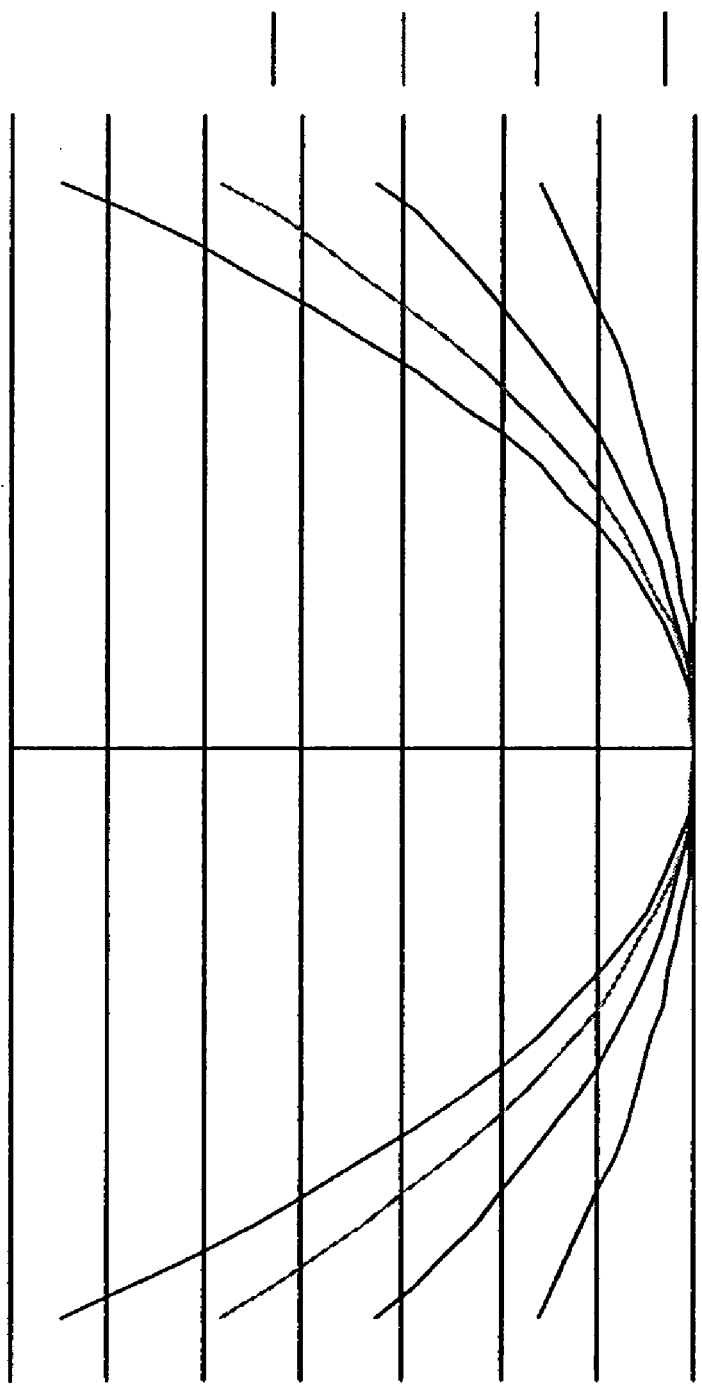
FIG. 2 is a graph for showing an illumination distribution in an optical pipe or secondary light source surface.

Since it has been known from the optical simulation that the light intensity distribution at the optical pipe 4's exit end 4b changes as shown in FIG. 2 according to the number of reflections of light that propagates in the optical pipe 4, the condenser optical system 3 is made of a zoom optical system that has a variable focal distance and the NA of light incident on the optical pipe 4 is made adjustable so as to make variable the number of reflections of light that propagates in the optical pipe 4. An adjustment that enables the light intensity distribution on the optical-pipe exit end 4b to increase at its peripheral would increase the light intensity distribution on the secondary light source surface 6b at its peripheral.

Such an adjustment of the focal distance of the condenser optical system 3 according to illumination conditions would provide the most effective light source distribution for each illumination condition. Alternatively, rather than making the condenser optical system 3 of the zoom optical system, it may be an optical system 3' having a different focal distance according to a switch of an illumination condition, (Second Adjusting Mechanism)

The focal distance of the condenser optical system 3 is fixed when the light intensity distribution on the optical-pipe exit end 4b exhibits a certain state. An ND filter is provided near the optical-pipe exit end 4b to adjust the light intensity distribution of the secondary light source surface. The transmittance distribution of the ND filter is adjusted such that the peripheral transmittance is higher than the center transmittance. Plural ND filters 20a to 20d having different transmittances are prepared, and made selectable by a turret 20 for each illumination condition.

(Third Adjusting Mechanism)

The focal distance of the condenser optical system 3 is fixed when the light intensity distribution on the optical-pipe exit end 4b exhibits a certain state. The light intensity distribution on the secondary light source surface 6b is made adjustable as shown in FIG. 2, by making the imaging zoom lens 5 of a zoom lens having variable distortion.

At least one of the above first to third adjusting mechanisms could adjust the secondary light source distribution for a desired effective light source distribution according to pupil transmittance distributions after the secondary light source surface 6b.

They are particularly effective to the pupil transmittance distribution that has a rotational symmetry and a decreased peripheral.

Figure 3:
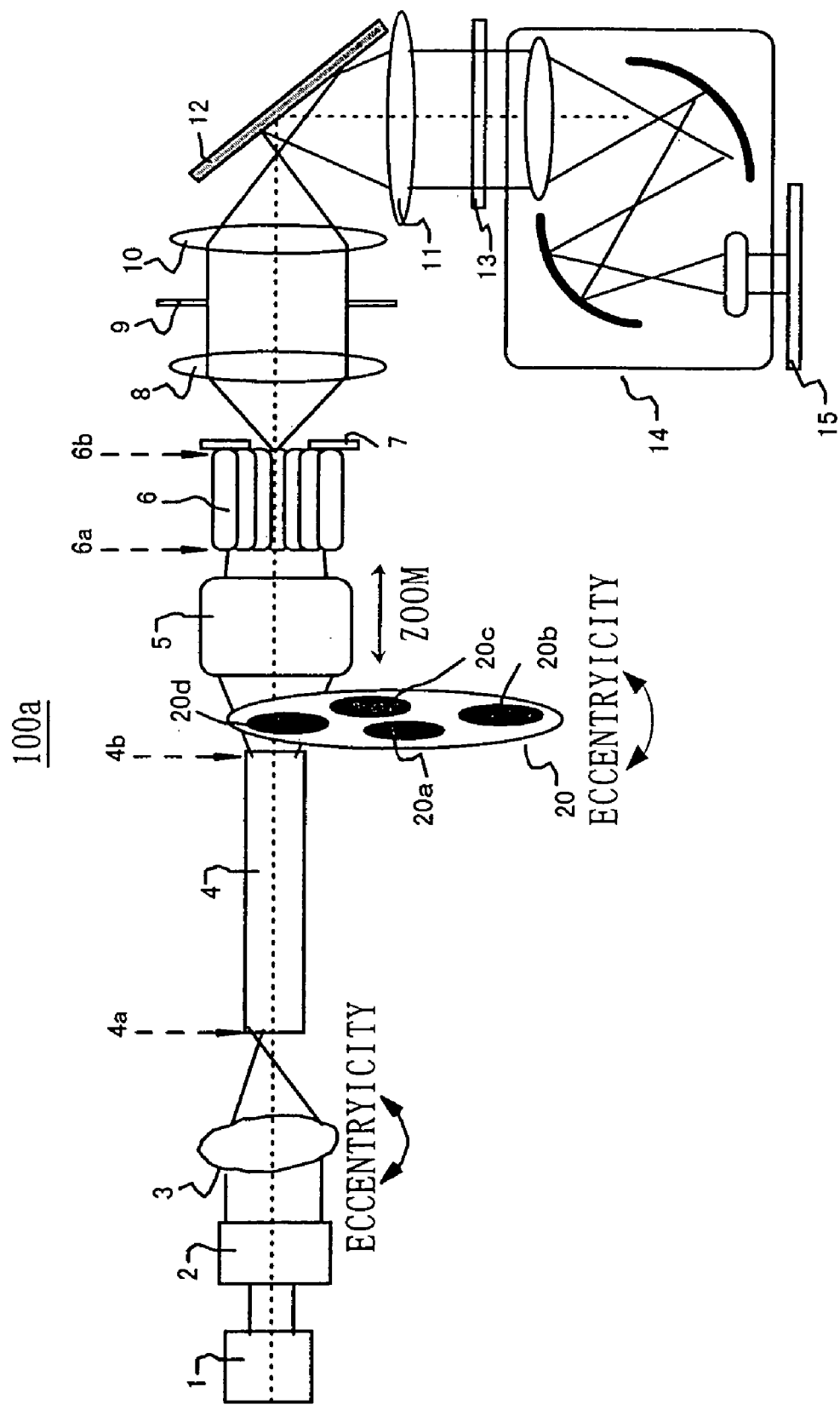
FIG. 3 is a schematic view of a simplified optical path in an exposure apparatus of a second embodiment according to the present invention.

FIG. 3 is a schematic view of a simplified optical path of the exposure apparatus 100a of a second embodiment according to the present invention. It is different from the exposure apparatus 100 in that it has a projection optical system of a catadioptric system. Those elements in FIG. 3 which are corresponding elements in FIG. 1 are designated by the same reference numerals.

Figure 11:
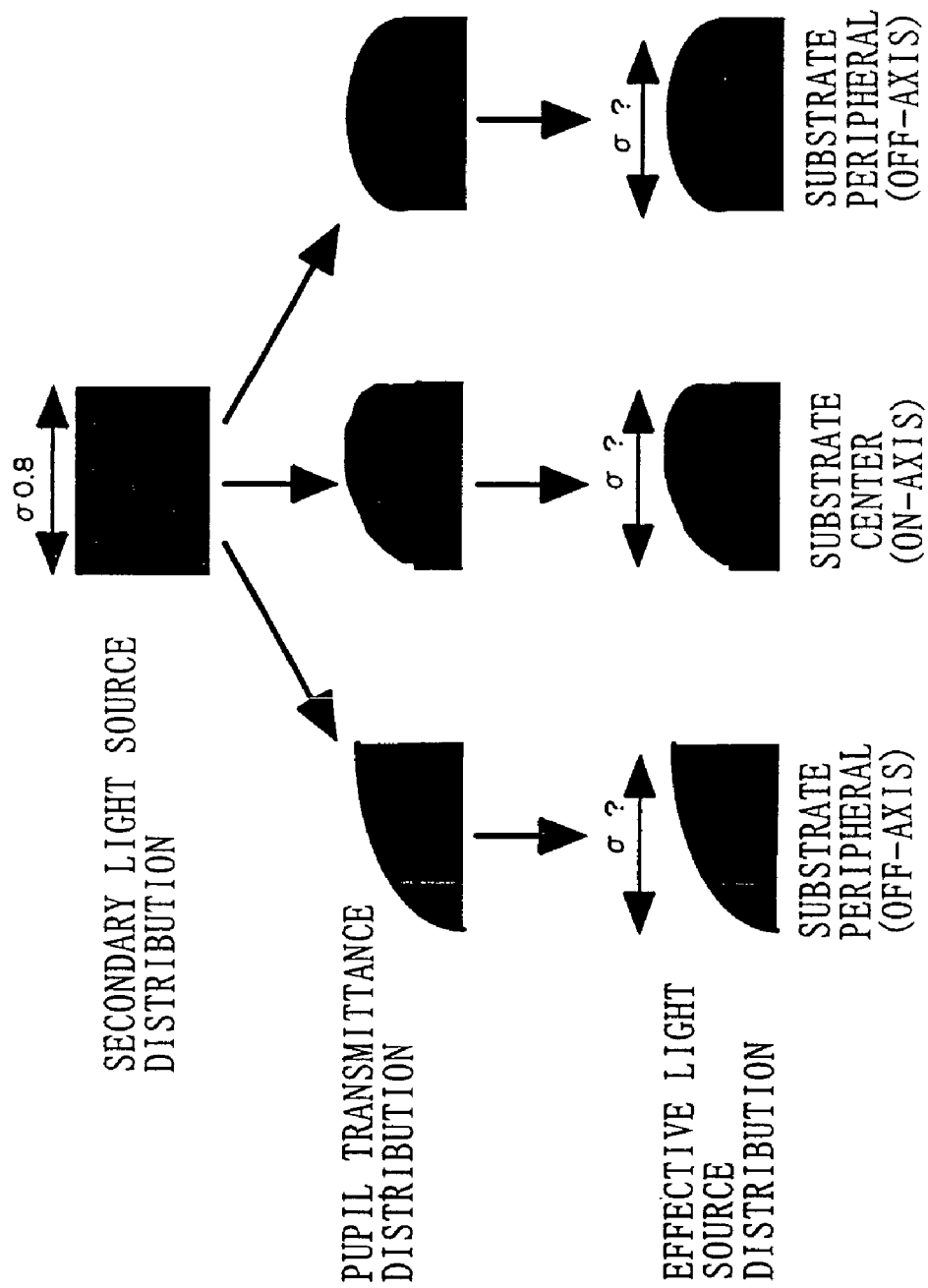
FIG. 11 shows a relationship among a secondary light source distribution, a pupil transmittance distribution, and an effective light source distribution in a conventional exposure apparatus using a catadioptric projection optical system.

The instant embodiment contemplates that the pupil transmittance distribution in the optical system from the secondary light source surface 6b to the wafer 15 has an inclination shown in the middle of FIG. 11. A detailed description will now be given of the secondary light source adjusting mechanism for obtaining a desired effective light source distribution for this pupil transmittance distribution.

(Fourth Adjusting Mechanism)

An effect of changing the focal distance of the condenser optical system 3 has been discussed for the first adjusting mechanism. The instant adjustment is characterized in that the distribution on the exit end 4b is inclined in a direction to cancel out the pupil transmittance distribution by biasing the light distribution incident onto the optical pipe 4.

This may be implemented, for example, by inclining the condenser optical system 3 eccentrically, or by decentering the condenser optical system 3 in parallel. Preferably, a function is provided for adjusting an eccentric amount according to switching illumination conditions.

Thus, the light intensity distribution of the secondary light source surface may be properly adjusted by making the condenser optical system 3 of a zoom optical system having a variable focal distance, and by decentering the optical element before the optical pipe 4. The condenser optical system 3 may include plural members that have different focal distances and are replaceable according to switching illumination conditions.

(Fifth Adjusting Mechanism)

The focal distance of the condenser optical system 3 is fixed when the light intensity distribution on the optical-pipe exit end 4b exhibits a certain state. An ND filter 20 is provided near the optical-pipe exit end 4b. The effect of this arrangement has been discussed for the second adjusting mechanism. The instant adjustment inclines the distribution on the secondary light source distribution in a direction to cancel out the pupil transmittance distribution by parallel shifting the ND filter 20.

Therefore, the ND filter is mounted on a drive mechanism for adjusting a shift amount, and the drive mechanism adjusts to the best shift amount for each illumination condition. Plural ND filters 20a to 20d having different transmittances are prepared, and made selectable according to switching illumination conditions.

At least one of the above first to fifth adjusting mechanisms could adjust the secondary light source distribution for a desired effective light source distribution according to pupil transmittance distributions after the secondary light source surface 6b.

They are particularly effective to the pupil transmittance distribution that mixes a rotationally symmetric component and a rotationally asymmetric component.

The optical system shown in FIG. 1 is exemplary, and a second fly-eye lens may be, for example, used instead of the optical pipe 4.

This case additionally uses a condenser lens instead of the imaging zoom lens 5 for superimposing and Koehler-illuminating light from the newly introduced second fly-eye lens on the subsequent fly-eye lens 6.

The adjusting mechanism is provided near the exit surface of the second fly-eye lens controls the transmittance in accordance with the angular distribution of the exposure light.

For example, a plate is inclinably arranged onto which a transmission control film that has characteristics of the transmittance of 93% at an incident angle of 0° and the transmittance of 98% at an incident angle of 5°. Plural plates having different transmission control amounts are prepared and replaceable according to switching illumination conditions. The inclination amount is also made variable.

Next follows a description of an adjusting mechanism for balancing the effective light source distributions at the center of and peripheral of the substrate. In general, the transmission loss of light that has passed many optical elements increases when the light has transmitted through part farther from the optical axis. Therefore, the pupil transmittance distribution of light that reaches the substrate peripheral (or off-axis) is likely to provide a rotationally asymmetrical distribution that inclines from the substrate center (or on-axis).

Although it is desirable to use the above first and fifth adjusting mechanisms to adjust and balance the on-axis and off-axis effective light source distributions in a permissible range, this requires a correction mechanism for correcting a difference between on-axis and off-axis pupil transmittance distributions to some extent.

Figure 4:
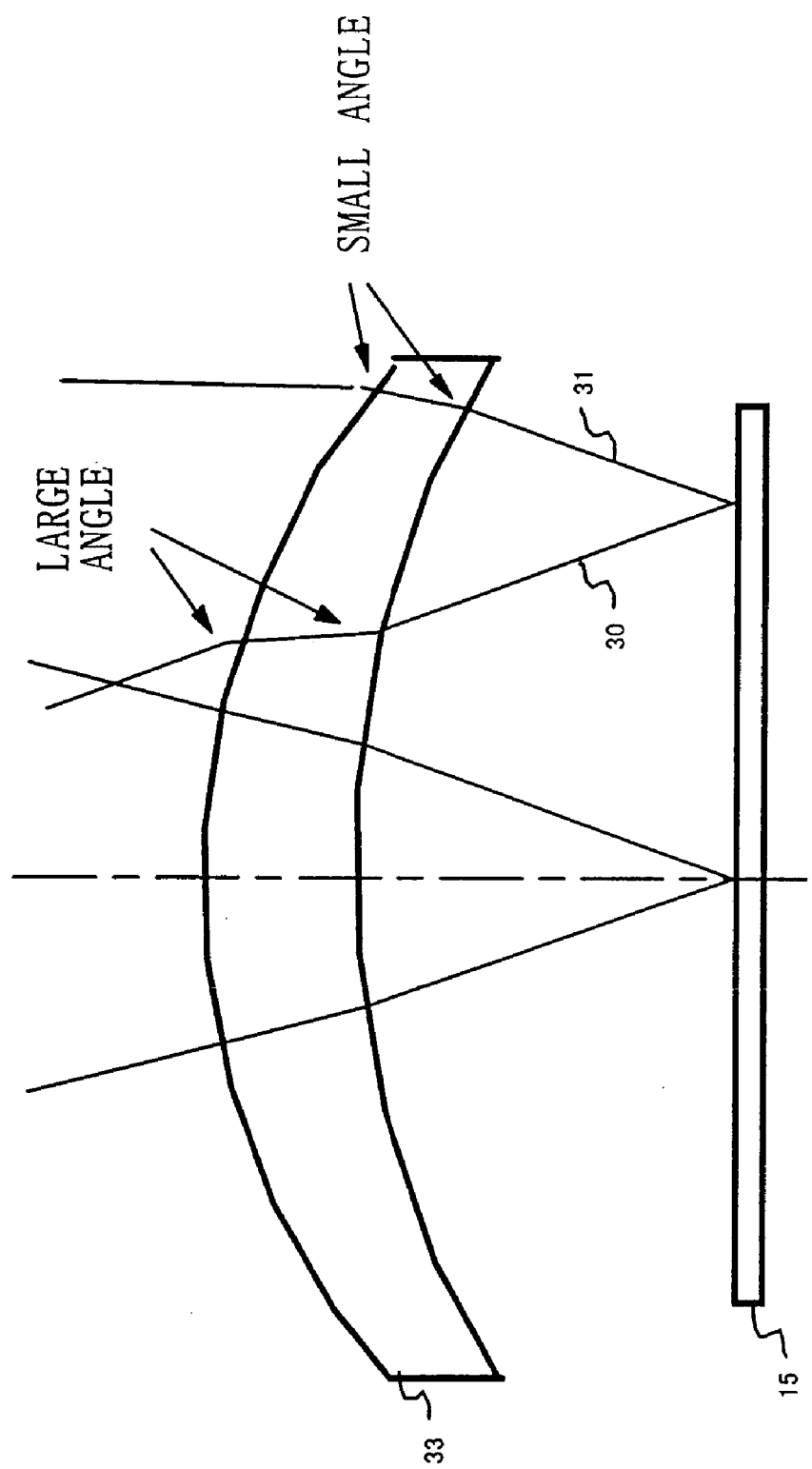
FIG. 4 is a schematic sectional view for explaining a method for correcting a difference between pupil transmittance of an on-axis and that of an off-axis.

A detailed description will now be given of the correction mechanism with reference to FIG. 4. The off-axis beams incident onto the plate 15 include a beam 30 closer to the optical axis and a beam 31 farther to the optical axis. The beam 31 receives a larger transmission loss than the beam 30 after transmitting through optical elements to the plate 15, and provides an off-axis effective light source distribution of a rotational asymmetry near the substrate peripheral.

In order to reduce a light-amount difference between the off-axis beam 30 and beam 31, a lens 33 is preferably a convex meniscus lens near the plate 15 or the reticle 13 or field stop 9 conjugate with the plate 15.

The beam 30 incident onto the convex meniscus lens 33 has a large angle with a large transmission loss, whereas the light 31 has a small angle with a small transmission loss. Thus, an effect of a reduced light-amount difference may be expected between the beams 30 and 31 that reach the wafer 15, with the off-axis excellent pupil transmittance distribution.

Figure 5:
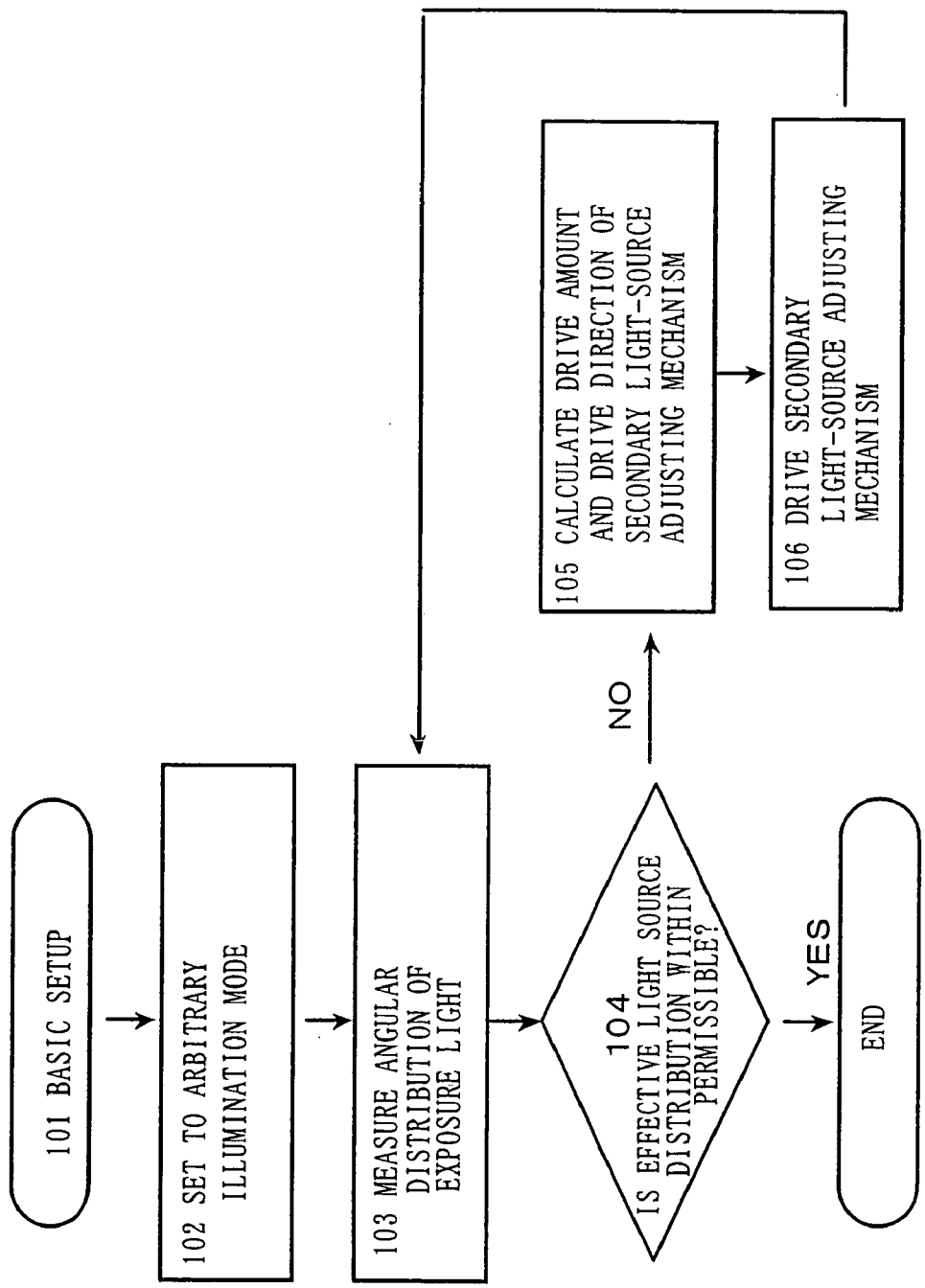
FIG. 5 is a flowchart showing a correction of effective light source distribution of one embodiment.

FIG. 5 is a flowchart for explaining a method for adjusting the secondary light source distribution. Step 101 calculates transmittance for each illumination condition from a wafer center to a wafer peripheral, referring to designed values (such as a lens design value, coating characteristic, glass material transmittance, and mirror reflection), and obtains approximate pupil transmittance distribution. The default setup for the secondary light-source adjusting mechanism is set based on the calculated pupil transmittance distribution information. Step 103 measures the angular distribution or effective light source distribution after Step 102 switches an illumination mode.

Figures 6A, 6B:
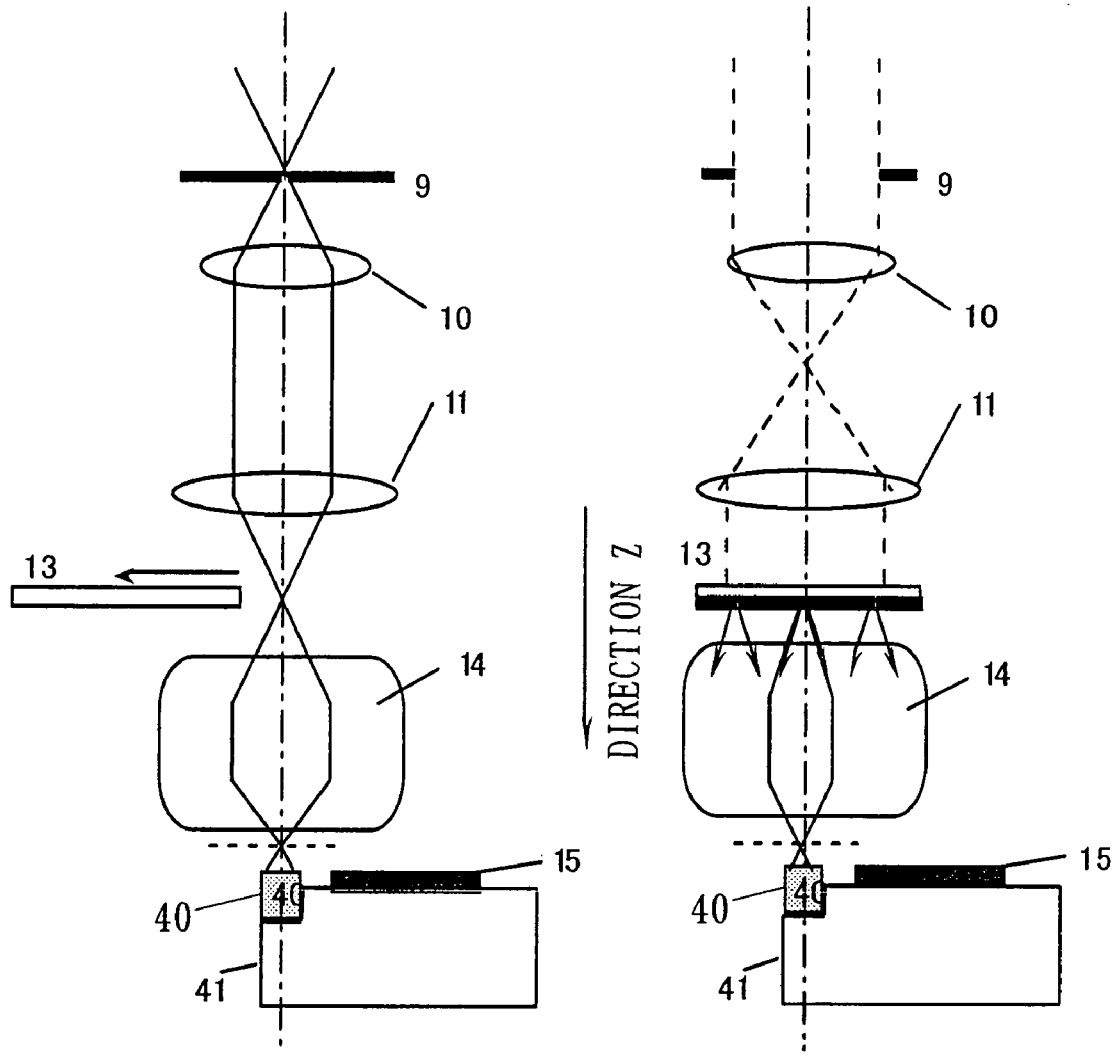
FIG. 6 is a sectional view showing a measuring method of an exposure-light angular distribution of one embodiment.

There are conceivable various methods for measuring the angular distribution of the exposure light, including, for example, a method for driving the field stop 9 to set a fine aperture corresponding to the substrate position to be measured, and for defocusing a detector 40 provided near the plate or wafer 15 in an optical-axis Z direction from an actual plate reference surface, while offsetting the reticle 13 out of the optical path. FIG. 6A shows the apparatus in this state. Those elements in FIG. 6A, which are the same as corresponding elements in FIG. 1 are designated by the same reference numerals. In addition, FIG. 6A omits the deflection mirror 12 for simplified description.

Only the exposure light limited by the field stop 9 once images on the plate 15 surface, and enters the detector 40 while reflecting its angle. The detector 40 is provided on the XY stage 41 for holding the plate 15, and has a pinhole at the top of its light-receiving surface which is small enough for the spread light. The XY stage horizontally moves this detector 40, for example, in a two-dimensionally spreading range, measures the incident-light intensity, and determines the angular distribution of the exposure light. A two-dimensional CCD may be used instead of the detector.

A similar measurement is available by providing a fine aperture at a position conjugate with the field stop 9. More specifically, it is conceivable as shown in FIG. 6B that the field stop 9 is released and a dedicated reticle using a Cr pattern to form a fine aperture is provided.

An angular distribution at each image point may be measured through measurements at arbitrary points using the above method.

The measured and detected angular distribution information is sent to a main controller (not shown), and Step 104 determines whether it is a desired effective light source distribution. If it is not, Step 105 instructs the main controller to calculate a drive amount and drive direction of the secondary light source adjusting mechanism, and Step 106 drives the secondary light source adjusting mechanism with a predetermined amount and direction. The procedure is fed back to Step 103 after driving, and measures the angular distribution of the exposure light again. When the effective light source distribution has a predetermined value, the adjustment ends. Otherwise, the above procedures repeat until it becomes a proper value.

A description will now be given of an exposure operation of the exposure apparatus shown in FIG. 1. In exposure, a beam emitted from the light source 1 is shaped into a desired beam shape by the beam shaping system 2, and then enters the condenser optical system 3. The laser beam from the condenser optical system 3 once condenses or images at the point P, and then enters as divergent light having a divergent angle the optical pipe 4.

The imaging zoom lens 5 images the optical pipe 4's exit surface 4b on the fly-eye 6's incident surface 6a with a predetermined demagnification. The above adjusting mechanism adjusts the secondary light source distribution formed near the fly-eye 6's exit surface 6b based on the subsequent transmittance distribution. The fly-eye lens 6 transmits the stop 7, and illuminates the field stop 9 through the illumination lens 8. The light that has passed the field stop 9 passes the imaging lens 10 and 11, and then illuminates the mask 13 surface.

The light, which has passed through the mask 13 is demagnified and projected under a specific demagnification onto the plate 15 through the imaging operation of the projection optical system 14. The angular distribution or effective light source distribution on the plate 15 becomes almost uniform due to the adjusting mechanism. When the exposure apparatus 100 is a stepper, the light source part and the projection optical system 14 are fixed, the mask 13 and plate 15 are synchronously scanned for exposure to all the shots. The wafer stage for the plate 15 is stepped to the next shot so as to expose and transfer a large number of shots onto the plate 15. On the other hand, the exposure apparatus 100 as a scanner would provide exposure with the mask 13 and the plate 15 in a stationary state.

Since the inventive exposure apparatus 199 uses the adjusting mechanism to make uniform the effective light source distribution by making complementary the secondary light source distribution and transmittance distribution, performing a pattern transfer to the resist with high precision, and providing high quality devices (such as semiconductor devices, LCD devices, image pick-up devices (such as CCDs), thin film magnetic heads, and the like).

Figure 7:
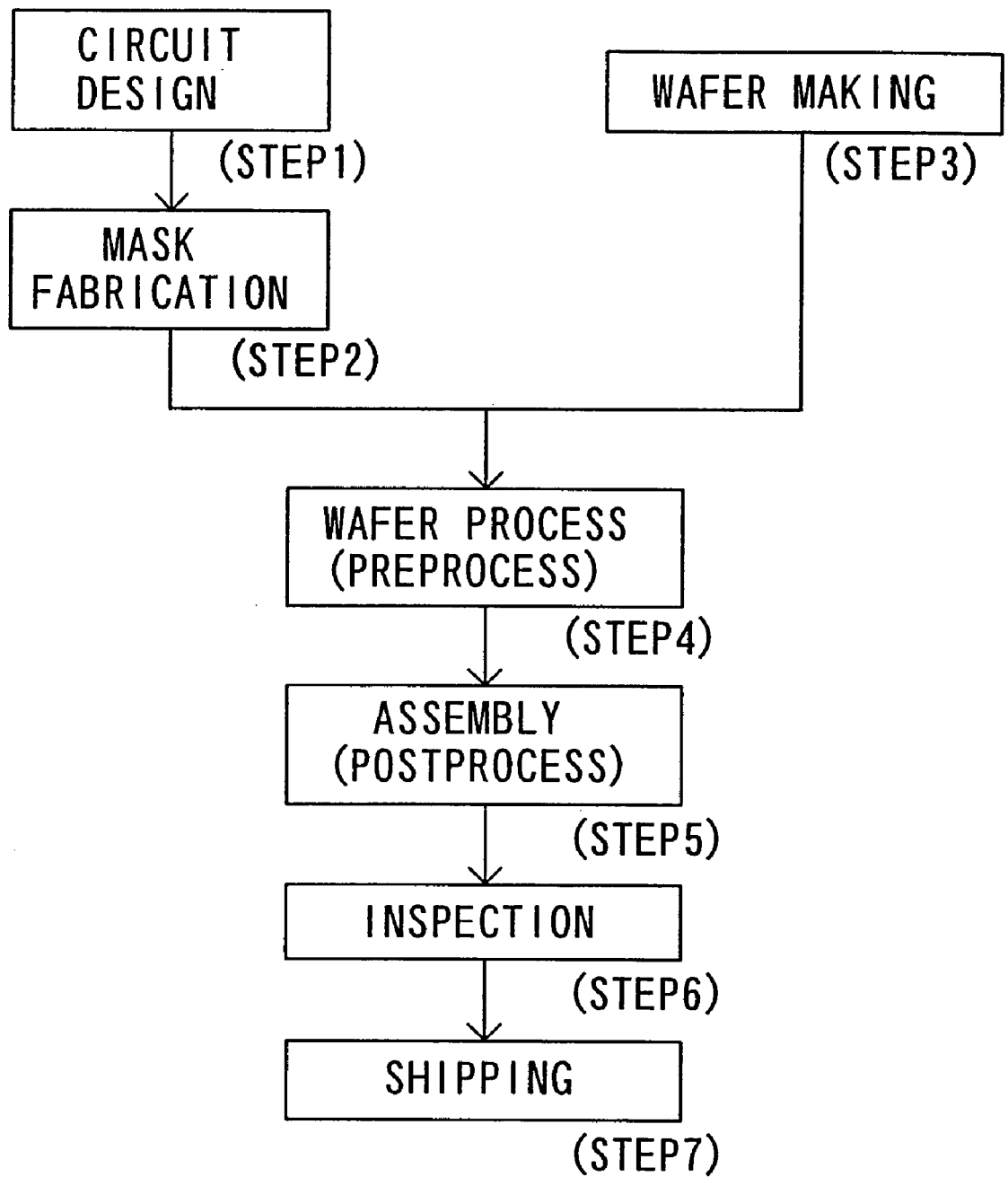
FIG. 7 is a flowchart for explaining a fabrication of devices (semiconductor chips such as ICs, LSIs, and the like, LCDs, CCDs, etc.).

A description will now be given of an embodiment of a device fabricating method using the above mentioned exposure apparatus 100. FIG. 7 is a flowchart for explaining how to fabricate devices (i.e., semiconductor chips such as IC and LSI, LCDs, CCDs, etc.). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography of the present invention using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 8:
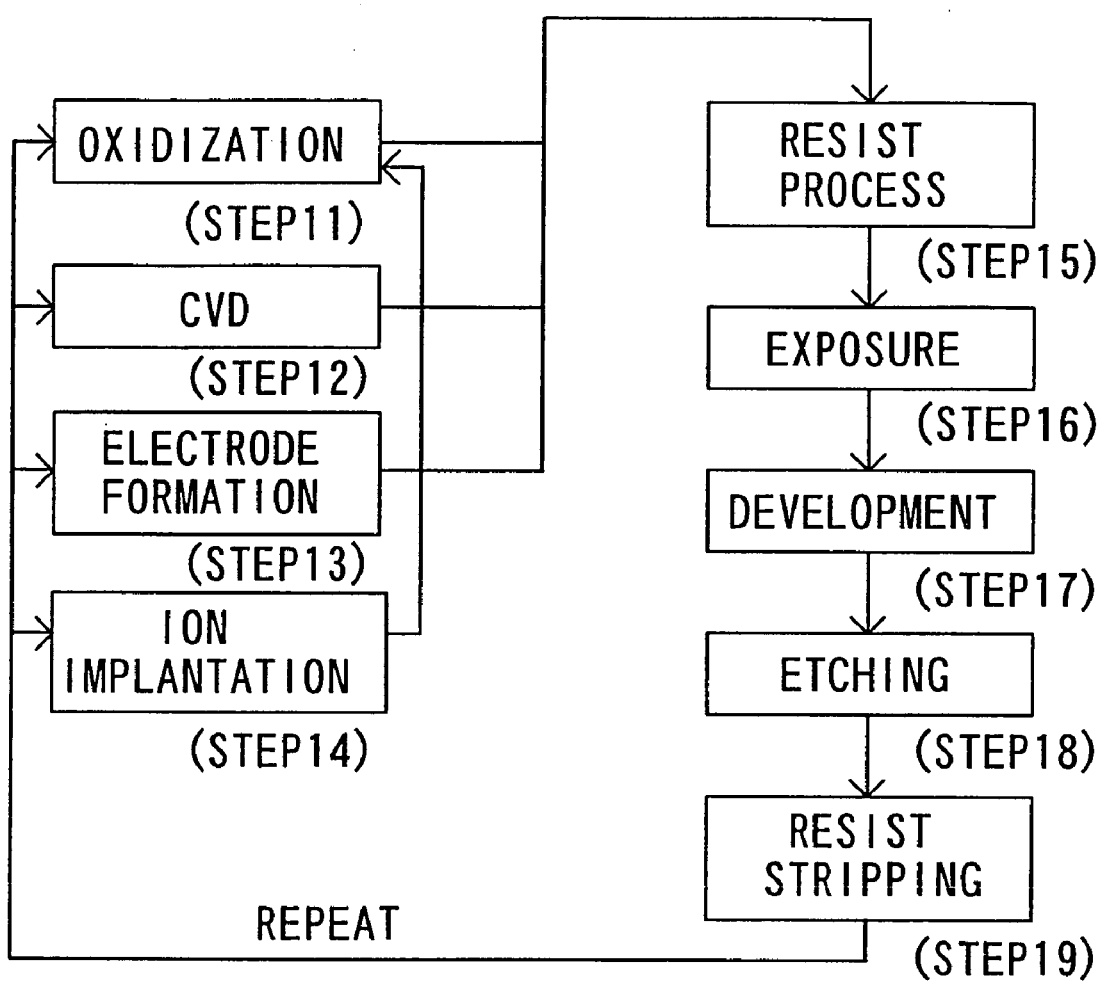
FIG. 8 is a detailed flowchart for Step 4 Wafer shown in FIG. 7.
Figure 9:
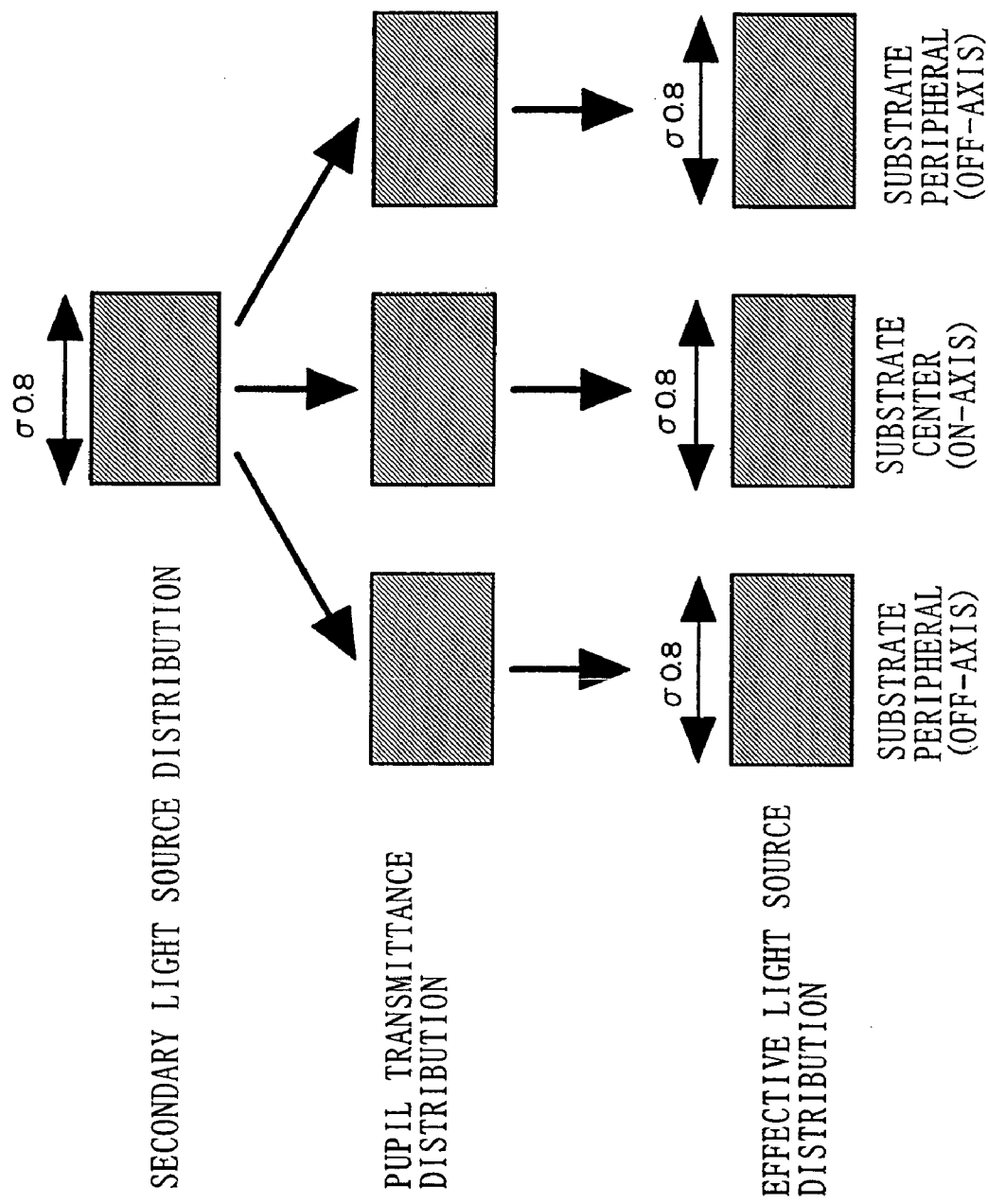
FIG. 9 shows a relationship among a secondary light source distribution, a pupil transmittance distribution, and an effective light source distribution in a conventional exposure apparatus.

FIG. 8 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching.

These steps are repeated, and multi-layer circuit patterns are formed on the wafer. The fabrication method of this embodiment would manufacture high quality semiconductor devices faster than the conventional method.

According to the instant embodiment, a desired effective light source distribution or angular distribution of exposure light incident onto a substrate may be obtained by adjusting the secondary light source distribution according to the transmittance distribution from the secondary light source surface to the substrate. A convex meniscus lens provide near a surface conjugate with the substrate would reduce a difference between on-axis and off-axis effective light source distributions. Thus, the exposure apparatus using a short wavelength and a high NA may form a desired effective light source distribution, and maintain its transfer performance with high precision.

Thus, the inventive exposure apparatus and method, and device fabrication method may obtain improved angular distribution of exposure light (or effective light source distribution) even for non-uniform transmittance distribution of an optical system (or pupil transmittance distribution), and reduce a difference in effective light source distribution between a substrate center and a substrate peripheral.

What is claimed is:

1. An exposure apparatus comprising:
    a projection optical system for projecting a pattern of a mask onto an object;
    an illumination optical system for forming a secondary light source surface approximately conjugate with a pupil in the projection optical system, and for illuminating the mask; and
    a secondary light source adjusting mechanism for adjusting a light intensity distribution on the secondary light source surface,
    wherein a transmittance distribution of an optical system provided from the secondary light source surface to the object, for a light that exits from each points on the secondary light source surface and enters to one point on the object is non-uniform, and
    wherein said secondary light source adjusting mechanism adjusts the light intensity distribution on the secondary light source surface to a tendency opposite to a tendency of the transmittance distribution.

2. An exposure apparatus according to claim 1, wherein said secondary light-source adjusting mechanism adjusts the light intensity distribution of the secondary light source according to the transmittance distribution and switching illumination condition.

3. An exposure apparatus according to claim 1, wherein said secondary light-source adjusting mechanism adjusts an angular distribution of exposure light incident onto the object.

4. A device fabricating method comprising the steps of:
    exposing a pattern of a mask onto an object using an exposure apparatus according to claim 1; and
    developing the exposed object.

5. An exposure method for exposing a pattern of a mask onto an object using an exposure apparatus that includes a projection optical system for projecting the pattern of the mask onto the object, and an illumination optical system for forming a secondary light source surface approximately conjugate with a pupil in the projection optical system and for illuminating the mask, said exposure method comprising the steps of:
    obtaining a non-uniform transmittance distribution of an optical system provided from the secondary light source surface to the object, for a light that exits from each points on the second light source surface and enters to one point on the object; and
    adjusting a light intensity distribution on the secondary light source surface to a tendency opposite to a tendency of the transmittance distribution.

* * * * *